(12) United States Patent  
Maier

(10) Patent No.: US 11,150,624 B2  
(45) Date of Patent: Oct. 19, 2021

(54) SYSTEM AND METHOD FOR FAIL-SAFE PROVISION OF AN ANALOG OUTPUT VALUE

(71) Applicant: Siemens Aktiengesellschaft, Munich (DE)

(72) Inventor: Mario Maier, Ensdorf (DE)

(73) Assignee: Siemens Aktiengesellschaft, Munich (DE)

( * ) Notice: Subject to any disclaimer, the term of this patent is extended or adjusted under 35 U.S.C. 154(b) by 204 days.

(21) Appl. No.: 16/454,956

(22) Filed: Jun. 27, 2019

(65) Prior Publication Data

US 2020/0004218 A1 Jan. 2, 2020

(30) Foreign Application Priority Data

Jun. 28, 2018 (EP) .................................... 18180299

(51) Int. Cl.
| | | |
|---|---|---|
| *G01R 19/252* | (2006.01) | |
| *G05B 19/05* | (2006.01) | |
| *G05B 23/02* | (2006.01) | |
| *G05B 13/02* | (2006.01) | |
| *G05B 19/042* | (2006.01) | |
| *G05B 9/00* | (2006.01) | |

(Continued)

(52) U.S. Cl.
CPC ......... *G05B 19/058* (2013.01); *G01R 19/252* (2013.01); *G05B 9/02* (2013.01); *G05B 9/03* (2013.01); *G05B 19/0425* (2013.01); *G05B 19/0426* (2013.01); *G05B 19/0428* (2013.01); *G05B 2219/14012* (2013.01); *G05B 2219/25127* (2013.01)

(58) Field of Classification Search
CPC ............ G05B 19/058; G05B 19/25127; G05B 19/0428; G05B 19/0426; G05B 9/03; G05B 19/0425; G01R 19/252  
USPC ............................................... 700/81, 79, 21  
See application file for complete search history.

(56) References Cited

U.S. PATENT DOCUMENTS

| | | | |
|---|---|---|---|
| 4,115,847 A * | 9/1978 | Osder .................. | G05D 1/0077 700/4 |
| 4,270,168 A * | 5/1981 | Murphy ............... | G05D 1/0077 714/10 |
| 4,785,222 A | 11/1988 | Pfalzgraf et al. | |

(Continued)

FOREIGN PATENT DOCUMENTS

| | | |
|---|---|---|
| DE | 102011085877 | 5/2013 |
| DE | 102014009354 | 12/2015 |
| EP | 0257181 | 3/1988 |

*Primary Examiner* — Ly D Pham  
(74) *Attorney, Agent, or Firm* — Cozen O'Connor

(57) ABSTRACT

A method for fail-safe provision of an analog output value for a control process designed for functional safety, wherein the output value is specified by a control unit as a digital output value and, in a first step, the digital output value is converted into the analog output value via a converter, in a second step, the analog output value is converted into a fail-safe digital output value using fail-safe criteria via a read-back device and, in a third step, the originally provided digital output value is compared with the converted fail-safe digital output value, where in the event of the comparison revealing a deviation or of a plausibility criterion being infringed, a safety action is performed, otherwise, the analog output value is output to the control process with the aid of a release device.

10 Claims, 3 Drawing Sheets

(51) Int. Cl.
  *G05B 9/03*      (2006.01)
  *G05B 9/02*      (2006.01)

(56) References Cited

U.S. PATENT DOCUMENTS

| | | | | |
|---|---|---|---|---|
| 4,940,102 | A  * | 7/1990 | Morishita | B62D 5/0439 180/446 |
| 6,647,301 | B1 * | 11/2003 | Sederlund | G05B 19/0428 700/108 |
| 2003/0057899 | A1 * | 3/2003 | LaCroix | H02P 29/02 318/114 |
| 2003/0058617 | A1 * | 3/2003 | LaCroix | B60R 16/0239 361/688 |
| 2004/0105664 | A1 * | 6/2004 | Ivankovic | H02P 7/29 388/800 |
| 2008/0279288 | A1 * | 11/2008 | Crawley | H03K 3/35613 375/244 |
| 2015/0070042 | A1 * | 3/2015 | Granig | G01D 3/036 324/762.01 |
| 2020/0272123 | A1 * | 8/2020 | Denenberg | B25J 9/1674 |

* cited by examiner

SYSTEM AND METHOD FOR FAIL-SAFE PROVISION OF AN ANALOG OUTPUT VALUE

BACKGROUND OF THE INVENTION

1. Field of the Invention

The invention relates to a system and method for fail-safe provision of an analog output value for a control process designed for functional safety, where the output value is specified as a digital output value by a control unit.

2. Description of the Related Art

Recent years have seen an exponential growth increase in the field of application of safety-related control systems (failsafe, functional safety) in automation, in particular industrial factory and process automation.

An essential requirement for a safety-related control system is the definition of a safe state, which as a rule, is an OFF state or the provision of fail-safe values. The OFF state or the provision of safe substitute values guarantee that a machine stops or assumes a state in which there is no danger to life and limb of the operator.

Currently, safety-related process control is achieved with fail-safe programmable logic control systems (F-PLC), where the acquisition of the required signals or triggering of the relevant actuators occurs via digital input/output assemblies. With digital output assemblies, only the two states OFF or ON are possible.

Nevertheless, automation still frequently also makes use of analog regulation processes. Once again fail-safe analog input assemblies are known for this purpose with which analog signals from sensors can be detected in a fail-safe manner. Nowadays, however, the response to these detected analog values also occurs digitally, i.e., in the form of digital output; this does not provide fail-safe analog value regulation.

SUMMARY OF THE INVENTION

In view of the foregoing, it is therefore an object of the invention to provide a fail-safe output module that enables fail-safe analog regulation up to safety integrity level (SIL3) in accordance with International Electrotechnical Commission (IEC) standard 61508, for example, for analog actuators, such as linear valves, control elements or servo motors with 0 to 20 mA, 4 to 20 mA, 0 to 10 V, +/−10 V or comparable interfaces.

This and other objects and advantages are achieved in accordance with the invention by a method for fail-safe provision of an analog output value for a control process designed for functional safety, where the output value is specified by a control unit as a digital output value, which comprises, in a first step, converting the digital output value into the analog output value via a converter. In a second step, the analog output value is converted into a fail-safe output value using fail-safe criteria via a read-back device. In a third step, the originally provided digital output value is compared with the converted fail-safe digital output value, in the event of the comparison revealing a deviation or of a plausibility criterion being infringed, a safety action is performed. Otherwise, the analog output value is output to the control process with the aid of a release device.

Here, the meaning of fail-safe criteria is that, for example, calculations are performed in two diverse ways or that corresponding assemblies are integrated in a dual-channel design or that two integrated computing processors monitor each other. In addition, use is also made of a safety-related bus protocol such as, for example, PROFI Safe. The IEC 61508 standard describes further fail-safe criteria.

In a first alternative embodiment, repeat conversion of the analog value into a digital value and then subsequent feedback into the control system makes it possible via a plausibility check or a comparison for an impermissible deviation of the actual value from the nominal value to be determined in the control system and, where in the event of a deviation, it is possible to initiate a safe state.

In a second alternative embodiment, the fail-safe digital output value is generated by the read-back device via two channels and the fail-safe analog output value generated via the first channel is compared with the originally provided digital output value. In addition, the fail-safe digital output value generated via the second channel is compared with the digital output value generated via the first channel.

Advantageously, with the method, a programmable logic control system designed for functional safety with a safety program, for example, a Simatic S7F with a safety-related, fault-tolerant program, is used as the control unit. It is considered to be particularly advantageous for an analog output assembly to be used as the converter, an analog input assembly configured for functional safety to be used as the read-back device and a digital output assembly designed for functional safety to be used as the release device.

Accordingly, in an exemplary discrete structure comprising three assemblies, the analog value to be output could be realized with an analog output assembly as a standard assembly, namely not an assembly designed for functional safety. On the other hand, the analog input assembly required for the feedback is a special assembly configured for functional safety.

Particularly advantageously, the method is used for the application of a fail-safe analog regulation process. Automation frequently makes use of analog regulation processes. Consequently, fail-safe analog input assemblies are also known for this purpose with which analog signals from sensors can be detected in a fail-safe manner. Nowadays, however, the response to these detected analog values also occurs digitally, i.e., so far, the digital output has not enabled fail-safe analog value regulation.

It is also an object of the invention to provide a system for fail-safe provision of an analog output value for a control process designed for functional safety. Herein, the system includes a control unit that specifies a digital output value, a converter that converts the digital output value into the analog output value, a read-back device that converts the analog output value into a fail-safe digital output value using fail-safe criteria, a release device that is configured to output the analog output value to the control process if the originally provided digital output value and the converted fail-safe digital output value are in conformity. In the event of a deviation or of a plausibility criterion being infringed, a safety action is performed by the control unit. Otherwise, the analog output value is output to the control process with the aid of the release device. Here, once again, the system can be realized in accordance with a first or second embodiment. In a first embodiment, the control unit is configured to compare the originally provided digital output value with the converted fail-safe digital output value where, in the event of the comparison revealing a deviation or of a plausibility criterion being infringed, a safety action is performed by the control unit. Otherwise, the control unit causes the analog output value to be output to the control process with the aid of the release device.

Advantageously, in the first embodiment, discrete assemblies are then constructed in the system. The control unit is then formed as a programmable logic control system configured for functional safety with a safety program. The converter is configured as an analog output assembly (standard) and the read-back device is formed as an analog input assembly configured for functional safety and the release device is formed as a digital output assembly configured for functional safety.

As an alternative to the presently contemplated embodiment, the system can also be constructed from an integrated assembly embodiment. Accordingly, there would then only be a fail-safe analog output assembly, which interacts with the control unit, where a read-back device comprising a first channel and a second channel is arranged in a fail-safe analog output module. Furthermore, a dual-channel testing device is provided, which is configured to compare a fail-safe digital output value provided via the first channel with the originally provided digital output value and in addition to compare a fail-safe digital output value provided via the second channel with the fail-safe digital output value of the first channel.

BRIEF DESCRIPTION OF THE DRAWINGS

The drawing shows two different exemplary embodiments of the invention, in which.

DETAILED DESCRIPTION OF THE EXEMPLARY EMBODIMENTS

Figure 1:
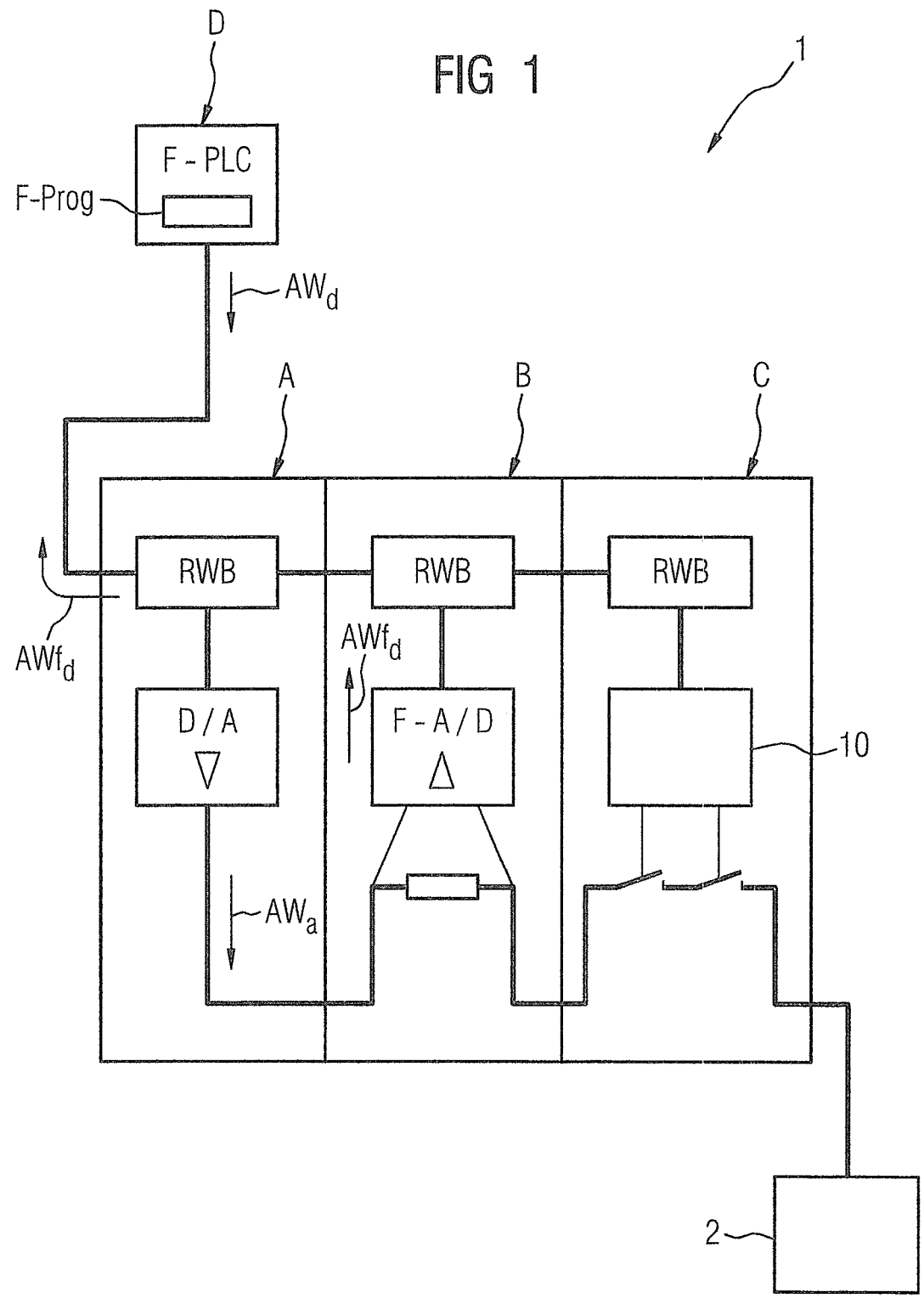
FIG. 1 is schematic illustration of a system for fail-safe provision of an analog output value in a discrete structure of three different assemblies in accordance with the invention.

FIG. 1 depicts a system 1 for the fail-safe provision of an analog output value $AW_a$ for a control process designed for functional safety. The analog output value $AW_a$ is ultimately to be applied to an actuator 2 with an analog interface. In accordance with the invention, the digital output value $AW_d$ provided by a control unit D is converted with an analog output assembly A into an analog output value $AW_a$, where this converted analog output value $AW_a$ is read back with a fail-safe analog input assembly B and converted into a fail-safe digital output value $AWf_d$. The analog output assembly A and the fail-safe analog input assembly B are connected via a backplane bus RWB. The control unit D can also communicate with the assemblies A,B via the backplane bus RWB.

The fail-safe digital output value $AWf_d$ generated by the fail-safe analog input assembly B is provided to the control unit D, which compares the originally provided digital output value $AW_d$ with the converted fail-safe digital output value $AWf_d$. In the event of the comparison revealing a deviation or of a plausibility criterion being infringed, a safety action is performed. Otherwise, the analog output value $AW_a$ is output to the control process with the aid of a release device arranged in a fail-safe digital output assembly C. Accordingly, the release device or the fail-safe digital output assembly C is configured to forward the analog output value $AW_a$ to the control process when instructed by the control unit D, for example, by a switch via a triggering device 10.

For digital-to-analog conversion, the analog output assembly A comprises a digital-analog converter D/A including an amplifier and level adaptation. For reconversion from an analog value into a digital value, the fail-safe analog input assembly B comprises a fail-safe analog-digital converter F-A/D including level adaptation. In the fail-safe digital output assembly C, which can, on the one hand, be configured as a fail-safe digital output or as a fail-safe relay output, the release device is formed as a(logic) triggering device 10, which comprises or can trigger two series-connected switches to forward the analog output value $AW_a$.

Figure 2:
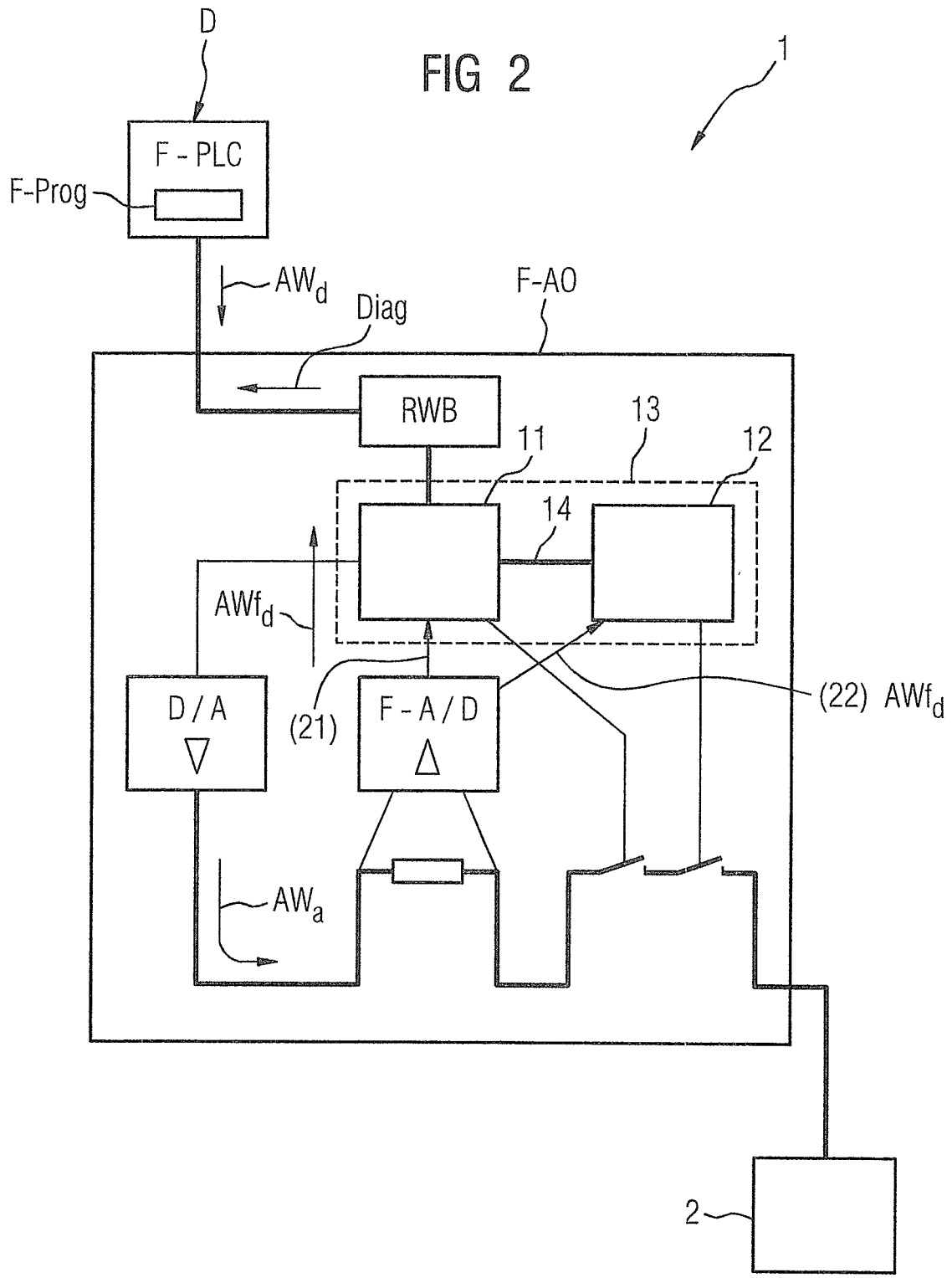
FIG. 2 is schematic illustration of an alternative embodiment of the system for the fail-safe provision of an analog output value in an integrated configuration, where the functionalities are realized in a fail-safe analog output assembly.

FIG. 2 depicts an alternative embodiment of the systems 1 for fail-safe provision of an analog output value $AW_a$. The functions explained in FIG. 1 for the converter, the read-back device and the release device were structured discretely in FIG. 1 and in FIG. 2 are now realized in a fail-safe analog output assembly F-AO.

The control unit D again provides a digital output value $AW_d$, which is guided by the control unit D via a backplane bus RWB in the fail-safe analog output module F-AO. The fail-safe analog output module F-AO now comprises a first triggering device 11 and a second triggering device 12 as release device. The first and second triggering devices 11,12 are embedded in a dual-channel tester 13. The fail-safe analog-digital converter F-AD provides a fail-safe digital output value AFfd via a first channel 21 and via a second channel 22 in each case.

The dual-channel tester is configured to compare a fail-safe digital output value $AWf_d$ provided via the first channel 21 with the originally provided digital output value $AW_d$ and, in addition, to compare a fail-safe digital output value $AWf_d$ provided via the second channel 22 with the fail-safe digital output value $AWf_d$ of the first channel 21.

If a valid analog output value $AW_a$ is present, the first triggering device 11 can close a switch to forward the analog output value $AW_a$. After verification of the digital output value $AW_d$ provided digitally via the first channel 21 with the digital output value $AW_d$ provided via the second channel 22, the second triggering device 12 can close the second switch to output the analog output value $AW_a$ and, hence, the analog output value $AW_a$ can be sent to the actuator with an analog interface. For the verification, the first and the second triggering devices 11, 12 comprise a comparator connection 14. If one of the two comparisons fails, not only is the output value $AW_a$ not released, but in addition a diagnostic message Diag is sent to the control system D.

Figure 3:
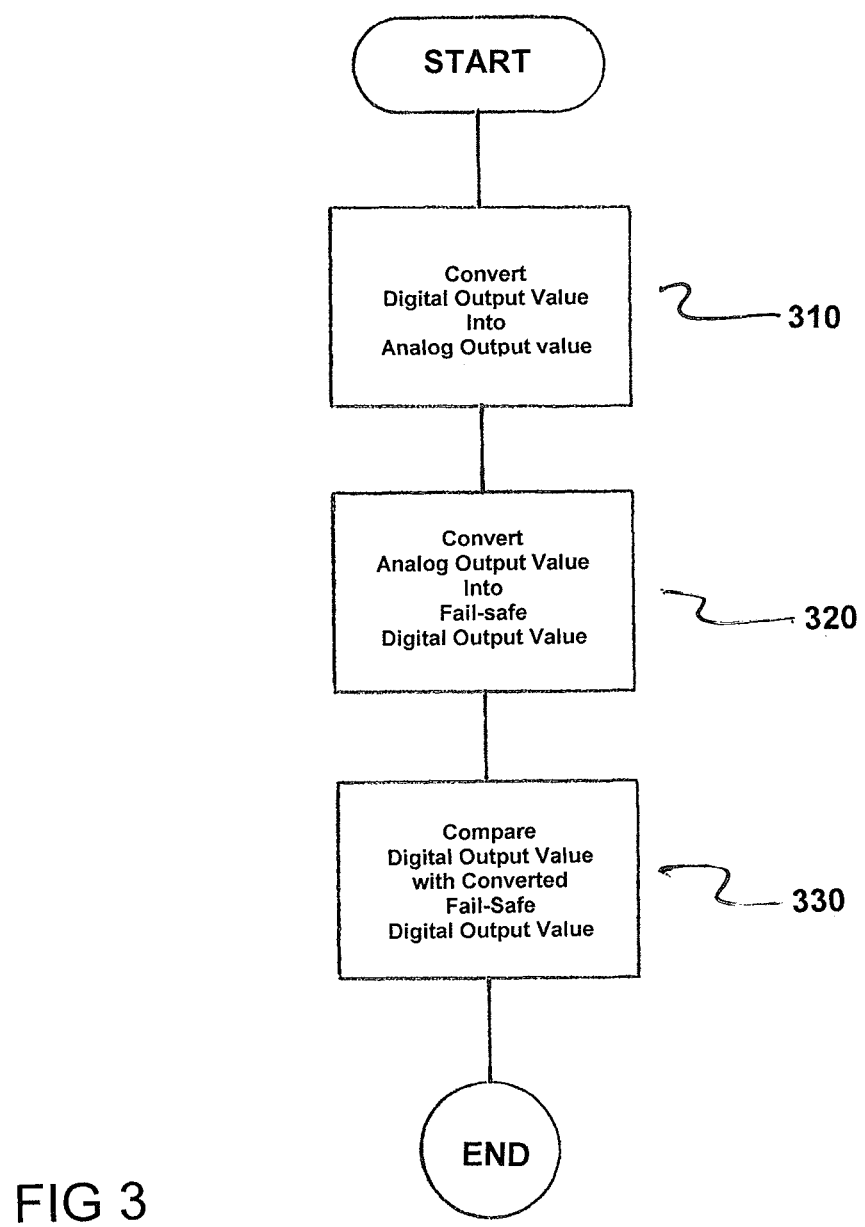
FIG. 3 is a flowchart of the method in accordance with the invention.

FIG. 3 is a flowchart of the method for fail-safe provision of an analog output value $AW_a$ for a control process designed for functional safety, where the output value AW is specified by a control unit D as a digital output value $W_d$. The method comprises converting the digital output value $AW_d$ into the analog output value $AW_a$ via a converter, as indicated in step 310.

Next, the analog output value $AW_a$ is converted into a fail-safe digital output value $AWf_d$ utilizing fail-safe criteria via a read-back device, as indicated in step 320.

The originally provided digital output value $AW_d$ is now compared with the converted fail-safe digital output value $AWf_d$, as indicated in step 330. In an event of the comparison revealing either a deviation or a plausibility criterion being infringed, a safety action being performed, otherwise, the analog output value $AW_a$ being output to the control process aided by a release device.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for fail-safe provision of an analog output value for a control process to provide functional safety, wherein the output value is specified by a control unit as a digital output value, the method comprising:
    converting the digital output value into the analog output value via a converter comprising an analog output assembly;
    converting the analog output value into a fail-safe digital output value utilizing fail-safe criteria via a read-back device comprising an analog input assembly which provides functional safety;
    comparing an originally provided digital output value with the converted fail-safe digital output value, in an event of the comparison revealing one of (i) a deviation and (ii) a plausibility criterion being infringed, a safety action being performed, otherwise, the analog output value being output to the control process aided by a release device comprises a digital output assembly which provides functional safety;
    wherein the fail-safe digital output value is provided to the control unit and compared with the digital output value in the control unit.

2. The method as claimed in claim 1, wherein the control unit comprises a programmable logic control system configured to provide functional safety with a safety program.

3. The method as claimed in claim 1, wherein the method is implemented to apply a fail-safe analog regulation process.

4. A system for fail-safe provision of an analog output value for a control process to provide functional safety, the system comprising:
    a control unit which specifies a digital output value;
    a converter which converts the digital output value into the analog output value;
    a read-back device which converts the analog output value into a fail-safe digital output value utilizing fail-safe criteria;
    a release device which is configured to output the analog output value to the control process if an originally provided digital output value conforms to the converted fail-safe digital output value;
    wherein in an event of one of (i) non-conformity and or of a plausibility criterion being infringed, a safety action is performed by the control unit, otherwise, the analog output value is output to the control process aided by the release device; and
    wherein the converter comprises an analog output assembly, the read-back device comprises an analog input assembly which provides functional safety and the release device comprises a digital output assembly which provides functional safety.

5. The system as claimed in claim 4, wherein the control unit compares the originally provided digital output value with the converted fail-safe digital output value and, in an event of one of (i) the comparison revealing a deviation and (ii) a plausibility criterion being infringed, a safety action is performed by the control unit, otherwise, the control unit causes output of the analog output value to the control process aided by the release device.

6. The system as claimed in claim 5, wherein the control unit is configured as a programmable logic control system which provides functional safety with a safety program.

7. The system as claimed in claim 4, wherein the control unit is configured as a programmable logic control system which provides functional safety with a safety program.

8. The system as claimed in claim 4, further comprising:
    a dual-channel tester which compares a fail-safe digital output value provided via a first channel with the originally provided digital output value and in addition compares a fail-safe digital output value provided via a second channel with the fail-safe digital output value of the first channel;
    wherein the read-back device comprises the first channel and the second channel and is arranged in a fail-safe analog output module.

9. A method for fail-safe provision of an analog output value for a control process which provides functional safety, wherein the output value is specified by a control unit as a digital output value, the method comprising:
    converting the digital output value into the analog output value via a converter;
    converting the analog output value into a fail-safe digital output value utilizing fail-safe criteria via a read-back device;
    comparing an originally provided digital output value with the converted fail-safe digital output value, in an event of the comparison revealing one of (i) a deviation and (ii) a plausibility criterion being infringed, a safety action being performed, otherwise, the analog output value being output to the control process aided by a release device;
    wherein the fail-safe digital output value is generated by the read-back device via two channels and the fail-safe digital output value generated via a first channel is compared with the originally provided digital output value, and the fail-safe digital output value generated via a second channel is additionally compared with the fail-safe digital output value of the first channel.

10. A system for fail-safe provision of an analog output value for a control process designed for functional safety, the system comprising:
    a control unit which specifies a digital output value;
    a converter which converts the digital output value into the analog output value;
    a read-back device which converts the analog output value into a fail-safe digital output value utilizing fail-safe criteria;
    a release device which is configured to output the analog output value to the control process if an originally provided digital output value conforms to the converted fail-safe digital output value;
    wherein in an event of one of (i) non-conformity and or of a plausibility criterion being infringed, a safety action is performed by the control unit, otherwise, the analog output value is output to the control process aided by the release device; and wherein the fail-safe digital output value is generated by the read-back device via two channels and the fail-safe digital output value generated via a first channel is compared with the originally provided digital output value, and the fail-safe digital output value generated via a second channel is additionally compared with the fail-safe digital output value of the first channel.

* * * * *